US012610796B2

(12) United States Patent      (10) Patent No.:      US 12,610,796 B2
Hsieh et al.                       (45) Date of Patent:      Apr. 21, 2026

(54) STRUCTURE INCLUDING DISCRETE DIELECTRIC MEMBER FOR PROTECTING FIRST AIR GAP DURING FORMING OF SECOND AIR GAP

(71) Applicant: GlobalFoundries Singapore Pte. Ltd., Singapore (SG)

(72) Inventors: Curtis Chun-I Hsieh, Singapore (SG); Wei-Hui Hsu, Singapore (SG); Wanbing Yi, Singapore (SG); Juan Boon Tan, Singapore (SG)

(73) Assignee: GLOBALFOUNDRIES SINGAPORE PTE LTD, Singapore (SG)

( * ) Notice:  Subject to any disclaimer, the term of this patent is extended or adjusted under 35 U.S.C. 154(b) by 551 days.

(21) Appl. No.: 17/806,131

(22) Filed:  Jun. 9, 2022

(65)       Prior Publication Data
     US 2023/0402317 A1      Dec. 14, 2023

(51) Int. Cl.
     *H01L 21/76*        (2006.01)
     *H01L 21/764*       (2006.01)
     *H01L 21/768*       (2006.01)
(52) U.S. Cl.
     CPC ........ *H01L 21/764* (2013.01); *H01L 21/7682* (2013.01)
(58) Field of Classification Search
     None
     See application file for complete search history.

(56)       References Cited

U.S. PATENT DOCUMENTS 5,641,712 A    6/1997  Grivna et al.
     5,914,519 A    6/1999  Chou et al.

6,165,890 A    12/2000  Kohl et al.
     6,190,988 B1    2/2001  Furukawa et al.
     6,211,561 B1    4/2001  Zhao
     6,316,347 B1   11/2001  Chang et al.
     6,917,109 B2    7/2005  Lur et al.
                   (Continued)

FOREIGN PATENT DOCUMENTS

CN      107895711 A    4/2018
     DE       4239319 A1    4/1993
     DE       4333875 A1    4/1995

OTHER PUBLICATIONS

Park et al., "Air-Gaps for High-Performance, On-Chip Interconnect Part II: Modeling, Fabrication, and Characterization," Journal of Electronic Materials, 37:1534-46, 2008, 13 pages.

*Primary Examiner* — Nilufa Rahim

(74) *Attorney, Agent, or Firm* — Francois Pagette; Hoffman Warnick LLC

(57)       ABSTRACT

A structure includes a first air gap including a first opening defined in a first dielectric layer and a second dielectric layer over the first opening and closing an end portion of the first opening. A second air gap may be over at least a portion of the first air gap. The second air gap includes a second opening defined in the second dielectric layer and a third dielectric layer over the second opening and closing an end portion of the second opening. The second air gap has a pointed lower end portion. In another version, the structure includes a first air gap in a first dielectric layer, a second dielectric layer over the first air gap, and a discrete dielectric member positioned in the second dielectric layer and aligned over the first air gap.

18 Claims, 11 Drawing Sheets

(56)        References Cited

U.S. PATENT DOCUMENTS

| | | | |
|---|---|---|---|
| 6,984,577 B1 | 1/2006 | Zhao et al. | |
| 7,138,329 B2 | 11/2006 | Lur et al. | |
| 7,449,407 B2* | 11/2008 | Lur | H01L 23/53295 |
| | | | 257/E21.573 |
| 7,553,756 B2 | 6/2009 | Hayashi et al. | |
| 7,602,038 B2* | 10/2009 | Zhu | H01L 23/5222 |
| | | | 257/E21.573 |
| 7,790,601 B1 | 9/2010 | Choi et al. | |
| 8,232,618 B2 | 7/2012 | Breyta et al. | |
| 8,232,653 B2 | 7/2012 | Lee | |
| 8,298,911 B2 | 10/2012 | Lee | |
| 8,350,300 B2 | 1/2013 | Aoki | |
| 9,343,409 B2* | 5/2016 | Rha | H01L 23/53223 |
| 9,653,348 B1 | 5/2017 | Wu et al. | |
| 9,659,865 B2 | 5/2017 | Saka et al. | |
| 10,157,777 B2 | 12/2018 | He et al. | |
| 10,157,778 B2 | 12/2018 | Tsai et al. | |
| 10,171,007 B2 | 1/2019 | Verheijden et al. | |
| 10,211,146 B2 | 2/2019 | He et al. | |
| 10,361,152 B2 | 7/2019 | Su et al. | |
| 10,707,120 B1 | 7/2020 | Yami et al. | |
| 11,011,414 B2 | 5/2021 | Lin | |
| 11,069,561 B2* | 7/2021 | Eto | H01L 21/76831 |
| 11,127,678 B2 | 9/2021 | McGahay et al. | |
| 11,244,857 B2 | 2/2022 | Tsai et al. | |
| 2004/0097013 A1 | 5/2004 | Lur et al. | |
| 2007/0111508 A1* | 5/2007 | Hayashi | H01L 21/76802 |
| | | | 438/622 |
| 2008/0020488 A1 | 1/2008 | Clevenger et al. | |
| 2008/0038923 A1* | 2/2008 | Edelstein | H01L 23/53295 |
| | | | 257/E21.035 |
| 2008/0308898 A1* | 12/2008 | Gabric | C23C 16/308 |
| | | | 257/E21.573 |
| 2009/0200636 A1 | 8/2009 | Edelstein et al. | |
| 2009/0243108 A1* | 10/2009 | Gosset | H01L 23/53295 |
| | | | 257/E21.586 |
| 2009/0263951 A1* | 10/2009 | Shibata | H01L 21/76808 |
| | | | 257/E21.573 |
| 2010/0130001 A1* | 5/2010 | Noguchi | H01L 21/02697 |
| | | | 257/E21.584 |
| 2010/0301489 A1 | 12/2010 | Seidel et al. | |
| 2011/0018091 A1 | 1/2011 | Barth et al. | |
| 2011/0193230 A1 | 8/2011 | Nogami et al. | |
| 2011/0260326 A1* | 10/2011 | Clevenger | H01L 23/5222 |
| | | | 257/770 |
| 2012/0037962 A1* | 2/2012 | Breyta | H01L 21/7682 |
| | | | 257/E21.585 |
| 2012/0058639 A1 | 3/2012 | Sim et al. | |
| 2015/0200160 A1* | 7/2015 | Su | H01L 21/76897 |
| | | | 257/774 |
| 2015/0243544 A1 | 8/2015 | Alptekin et al. | |
| 2015/0262929 A1 | 9/2015 | Hsiao et al. | |
| 2016/0133508 A1 | 5/2016 | Gates et al. | |
| 2016/0141240 A1 | 5/2016 | Saka et al. | |
| 2016/0163816 A1 | 6/2016 | Yu et al. | |
| 2017/0213786 A1* | 7/2017 | Ahn | H01L 23/4821 |
| 2017/0330832 A1 | 11/2017 | He et al. | |
| 2018/0151491 A1* | 5/2018 | Briggs | H01L 21/76834 |
| 2019/0096742 A1 | 3/2019 | Tsai et al. | |
| 2019/0206718 A1 | 7/2019 | LiCausi et al. | |
| 2020/0020568 A1 | 1/2020 | Lin | |
| 2020/0105928 A1 | 4/2020 | Lee et al. | |
| 2020/0152736 A1 | 5/2020 | Yu et al. | |

* cited by examiner

STRUCTURE INCLUDING DISCRETE DIELECTRIC MEMBER FOR PROTECTING FIRST AIR GAP DURING FORMING OF SECOND AIR GAP

BACKGROUND

The present disclosure relates to integrated circuit (IC) fabrication, and more specifically, to structure including a discrete dielectric member for protecting an air gap during, for example, forming of another air gap for multi-layer air gap structures, and a related method.

Air gap structures are provided in a wide variety of IC systems to improve performance. Typically, air gap structures are formed by creating an opening in a dielectric layer, and then sealing the opening by deposition of a dielectric capping layer to cap the opening. Air gaps or combinations of air gaps that extend over more than one interconnect layer in an IC structure are advantageous to further improve performance. Forming a multi-layer air gaps in a consistent manner across a wafer presents many challenges in terms of center-to-edge variation and overall depth control. Where two air gaps are formed over one another, the formation of the opening for the second, upper air gap is challenging because the second opening can pierce the dielectric capping layer of the first air gap and laterally expose conductors adjacent the first air gap.

SUMMARY

All aspects, examples and features mentioned below can be combined in any technically possible way.

An aspect of the disclosure provides a structure, comprising: a first air gap including a first opening defined in a first dielectric layer and a second dielectric layer over the first opening; a second air gap over at least a portion of the first air gap, the second air gap including a second opening defined in at least a third dielectric layer over the second dielectric layer, and a fourth dielectric layer over the second opening; and wherein the second air gap has a pointed lower end portion.

Another aspect of the disclosure includes any of the preceding aspects, and at least one of the first, second, third and fourth dielectric layers include at least one of: a silane-based silicon dioxide, a tetraethyl orthosilicate (TEOS) based silicon dioxide and a fluorinated TEOS (FTEOS) based silicon dioxide.

Another aspect of the disclosure includes any of the preceding aspects, and the first air gap has a planar lower end portion.

Another aspect of the disclosure includes any of the preceding aspects, and at least one of the first air gap and the second air gap is positioned between conductors in the first dielectric layer and the second dielectric layer, respectively.

Another aspect of the disclosure includes any of the preceding aspects, and further comprising a third air gap defined in at least the third dielectric layer adjacent the second air gap, wherein the third air gap is devoid of an air gap thereunder in the first dielectric layer, and wherein the third air gap includes a planar lower end portion having a lowermost extent extending deeper into one of the second dielectric layer and the third dielectric layer than a lowermost extent of the second air gap.

An aspect includes a structure, comprising: a first air gap in a first dielectric layer; and a second dielectric layer over the first air gap; and a discrete dielectric member positioned in the second dielectric layer and aligned over the first air gap, the discrete dielectric member including a different dielectric material than the second dielectric layer.

Another aspect of the disclosure includes any of the preceding aspects, and further comprising a second air gap in at least a third dielectric layer over the second dielectric layer and over at least a portion of the first air gap, and the discrete dielectric member positioned in the second dielectric layer between the first air gap and the second air gap.

Another aspect of the disclosure includes any of the preceding aspects, and the first air gap includes a first opening defined in the first dielectric layer, the second dielectric layer closing an end portion of the first opening; and the second air gap includes a second opening defined in at least the third dielectric layer, and a fourth dielectric layer over an end portion of the second opening.

Another aspect of the disclosure includes any of the preceding aspects, and the first, second, third and fourth dielectric layers include least one of: a silane-based silicon dioxide, a tetraethyl orthosilicate (TEOS) based silicon dioxide and a fluorinated TEOS (FTEOS) based silicon dioxide.

Another aspect of the disclosure includes any of the preceding aspects, and at least one of the first air gap and the second air gap is positioned between conductors in the first dielectric layer and the third dielectric layer, respectively.

Another aspect of the disclosure includes any of the preceding aspects, and further comprising a third air gap defined in at least the third dielectric layer adjacent the second air gap, wherein the third air gap is devoid of an air gap thereunder in the first dielectric layer, and wherein the third air gap includes a lowermost extent extending deeper into one of the second and third dielectric layers than a lowermost extent of the second air gap.

Another aspect of the disclosure includes any of the preceding aspects, and the third air gap includes a planar lower end portion.

Another aspect of the disclosure includes any of the preceding aspects, and the first air gap includes a first opening defined in the first dielectric layer, and wherein the discrete dielectric member is over an end portion of the first opening; and wherein the second air gap includes a second opening defined in at least a third dielectric layer over the second dielectric layer, and a fourth dielectric layer is over the second opening.

Another aspect of the disclosure includes a method, comprising: forming a first opening in a first dielectric layer; forming a second dielectric layer over the first opening to one of: stop before sealing the first opening to leave an end portion of the first opening open, and close the end portion of the first opening to form a first air gap, wherein the second dielectric layer includes an indentation in an upper surface thereof over the end portion of the first opening; forming a discrete dielectric member in the indentation, wherein where the end portion remains open after forming the second dielectric layer, the discrete dielectric member closes the end portion of the first opening to form the first air gap; forming a third dielectric layer over the second dielectric layer and the discrete dielectric member; forming a second opening in at least the third dielectric layer over at least a portion of the first air gap; and forming a fourth dielectric layer over the second opening to close an end portion of the second opening and form a second air gap.

Another aspect of the disclosure includes any of the preceding aspects, and forming the discrete dielectric member includes depositing another dielectric layer over the first dielectric layer and in the indentation, and planarizing the another dielectric layer, and the discrete dielectric member has a pointed end portion and a planar surface opposing the pointed end portion.

Another aspect of the disclosure includes any of the preceding aspects, and forming the second opening includes etching the second opening to expose the discrete dielectric member.

Another aspect of the disclosure includes any of the preceding aspects, and further comprising expanding at least one of: a lateral extent of the first opening after forming the first opening, and a lateral extent of the second opening after forming the second opening.

Another aspect of the disclosure includes any of the preceding aspects, and forming at least one of the second dielectric layer and the fourth dielectric layer includes depositing at least one of: a silane-based silicon dioxide, a tetraethyl orthosilicate (TEOS) based silicon dioxide and a fluorinated TEOS (FTEOS) based silicon dioxide.

Another aspect of the disclosure includes any of the preceding aspects, and further comprising forming a third air gap defined in at least the third dielectric layer adjacent the second air gap, wherein the third air gap is devoid of an air gap thereunder in the first dielectric layer, and wherein the third air gap includes a lowermost extent extending deeper into the second dielectric layer than a lowermost extent of the second air gap.

Another aspect of the disclosure includes any of the preceding aspects, and forming a capping layer over the third dielectric layer prior to forming the second opening, and after forming the second opening, removing the discrete dielectric member.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
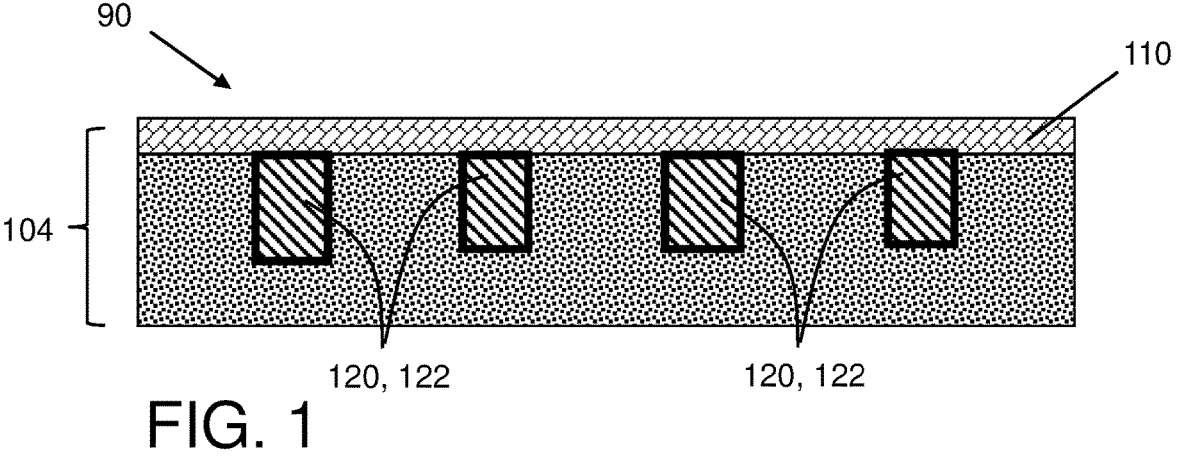
FIG. 1 shows a cross-sectional view of an initial structure for a method, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The present disclosure relates to a structure including a discrete dielectric member for protecting an air gap during, for example, formation of another air gap as part of a multi-layer air gap structure. The structure may include a first air gap including a first opening defined in a first dielectric layer and a second dielectric layer over the first opening and closing an end portion of the first opening. A second air gap may be over at least a portion of the first air gap. The second air gap includes a second opening defined in at least a third dielectric layer and a fourth dielectric layer over the second opening and closing an end portion of the second opening. The second air gap may have a pointed lower end portion, which was formerly filled with the discrete dielectric member. In another version, the structure includes a first air gap in a first dielectric layer, a second dielectric layer over the first air gap, and the discrete dielectric member remains positioned in the second dielectric layer and aligned over the first air gap. A method of forming the structures is also provided. The discrete dielectric member prevents forming of the opening for the second air gap from penetrating the first, lower air gap, and prevents non-uniform center-to-edge dimensions and/or non-uniform depths of the first air gaps across a wafer.

Referring to FIG. 1, a cross-sectional view of an initial structure 90 for a method of forming a structure 164, 198 (FIGS. 9, 10 and 13-16, respectively) according to embodiments of the disclosure, is illustrated.

FIG. 1 shows initial structure 90 after forming a first dielectric layer 104 including conductors 120 therein. First dielectric layer 104 may function as any interconnect layer, e.g., middle-of-line (MOL) or back-end-of-line (BEOL). Dielectric layer 104 may include a contact layer or a metal layer. In the non-limiting example in FIG. 1, dielectric layer 104 provides a metal layer. In any event, dielectric layer 104 layer may include an interlayer dielectric (ILD). ILDs may include but are not limited to: silicon nitride ($Si_3N_4$), silicon dioxide ($SiO_2$), fluorinated $SiO_2$ (FSG), a silane-based silicon dioxide, a tetraethyl orthosilicate (TEOS) based silicon dioxide and a fluorinated TEOS (FTEOS) based silicon dioxide. In other embodiments, ILD may include any appropriate low dielectric constant (low-K) material. Dielectric layer 104 may also include a cap layer 110 at an upper surface thereof. Cap layer 110 may include one or more layers. For example, cap layer 110 may act as an etch stop layer, and be formed from silicon nitride (nitride), silicon carbon nitride (SiCN) and/or silicon oxide ($SiO_2$), among other layers. As understood, various other forms of cap layers may also be employed.

A number of conductors 120 may extend through or into dielectric layer 104, and/or to other conductors in an underlying or overlying interconnect layer. In the example shown in FIG. 1, conductors 120 are in the form of metal wires 122. As understood, each conductor 120 may include a conductor such as aluminum or copper, within a refractory metal liner of ruthenium. However, other refractory metals such as tantalum (Ta), titanium (Ti), tungsten (W), iridium (Jr), rhodium (Rh) and platinum (Pt), etc., or mixtures of thereof, may also be employed. Typically, contacts (not shown) extend mostly vertically to connect conductors in layers thereof, i.e., vertically on page as illustrated. In contrast, metal layers may include a number of metal wires 122 therein. Each metal wire 122 may use the same materials as listed for contacts. In contrast to contacts, metal wires 122 extend mostly horizontally or laterally in a layer to connect to other conductors, i.e., into, out of, or across a page as illustrated. Initial structure 90, as illustrated in FIG. 1, can be formed using any now known or later developed semiconductor fabrication techniques, e.g., material deposition, photolithographic patterning and etching, planarization, etc.

"Depositing" or "deposition," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
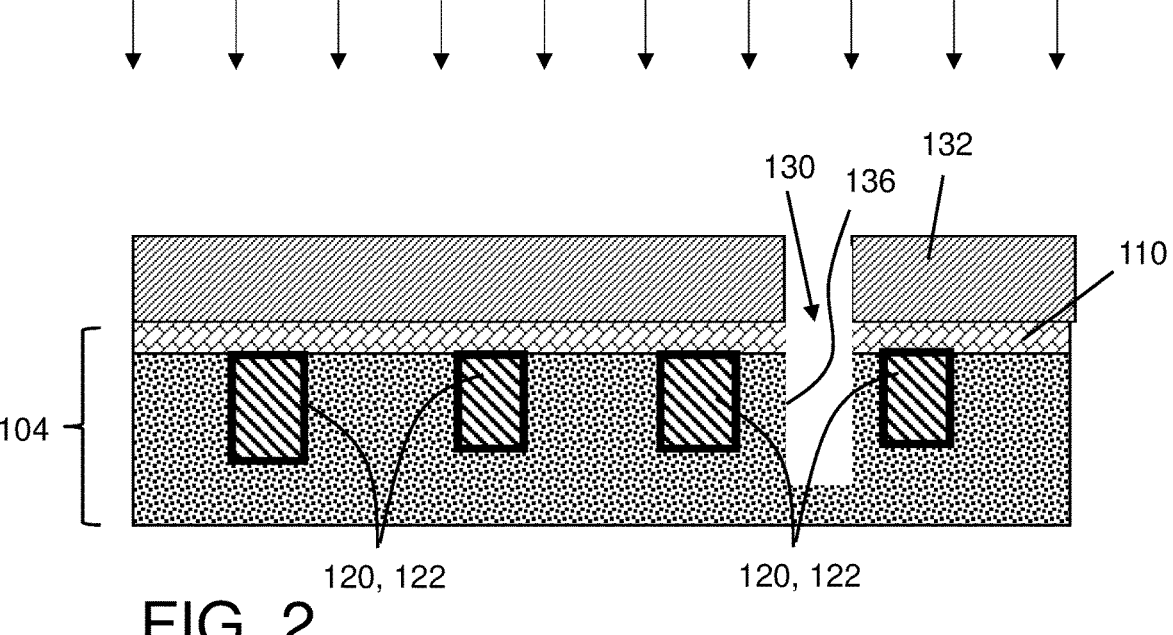
FIG. 2 shows a cross-sectional view of etching a first opening for a first air gap, according to embodiments of the disclosure.

FIG. 2 shows forming a first opening 130 (one shown for clarity) in first dielectric layer 104, e.g., between adjacent conductors 120. Opening 130 may be formed in several ways. FIG. 2 shows forming an air gap mask 132 (hereafter "mask 132") exposing a portion of dielectric layer 104. Mask 132 may be formed, for example, post planarization of dielectric layer 104, e.g., via chemical mechanical polishing (CMP), and may include any now known or later developed masking material. Mask 132 is patterned and etched in a conventional fashion to create openings therein for creating openings 130.

FIG. 2 also shows a cross-sectional view of etching opening 130 (arrows) through dielectric layer 104 using mask 132. Opening 130 exposes sidewalls 136 of dielectric layer 104. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while leaving another material (such as polysilicon or nitride) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as trench isolation trenches. In FIG. 2, the etching may include a RIE.

Opening 130 may extend to a depth that can be user selected, e.g., based on etching duration or chemistry. With regard to opening 130 depth, etching opening 130 may cease when opening 130: meets or extends to an etch stop layer of an underlying layer or transistor; recesses the etch stop layer; removes (extends beyond) the etch stop layer, perhaps exposing a silicide layer of a transistor; exposes a body of a transistor, e.g., if silicide layer is not present or has been removed entirely; or as shown, does not expose any etch stop layer or underlying layer by not extending entirely through first dielectric layer 104.

Figures 3, 4:
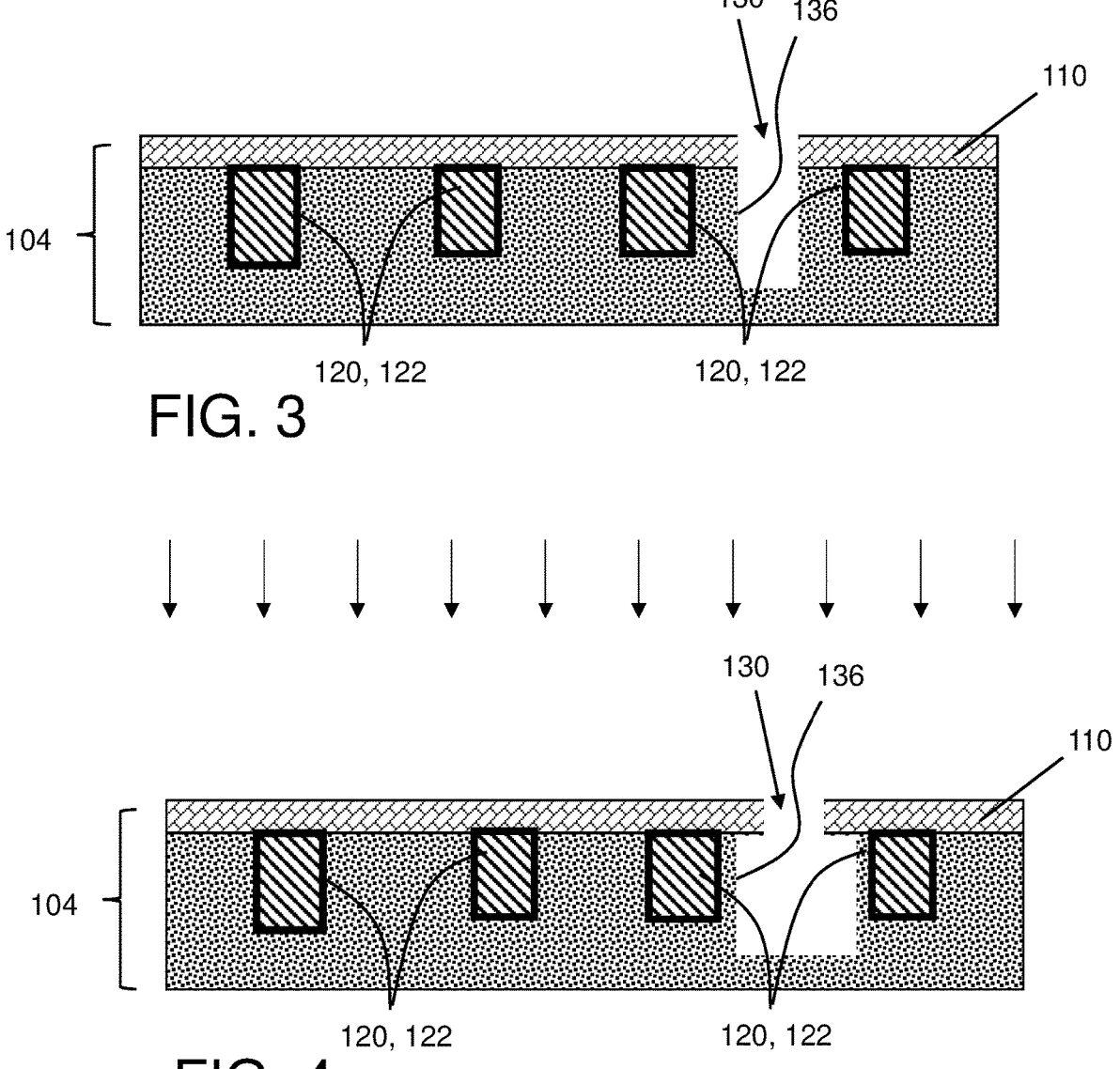
FIG. 3 shows a cross-sectional view of removing an air gap mask after etching the first opening, according to embodiments of the disclosure.
FIG. 4 shows a cross-sectional view of optionally recessing the first opening, according to embodiments of the disclosure.

FIG. 3 shows a cross-sectional view of the structure after removing mask 132 (FIG. 1). Mask 132 may be removed using any known removal process appropriate for the mask material, e.g., a wet etch for hard nitride mask or an ashing process (oxygen dry strip process) for a soft resist-based mask.

Figure 6:
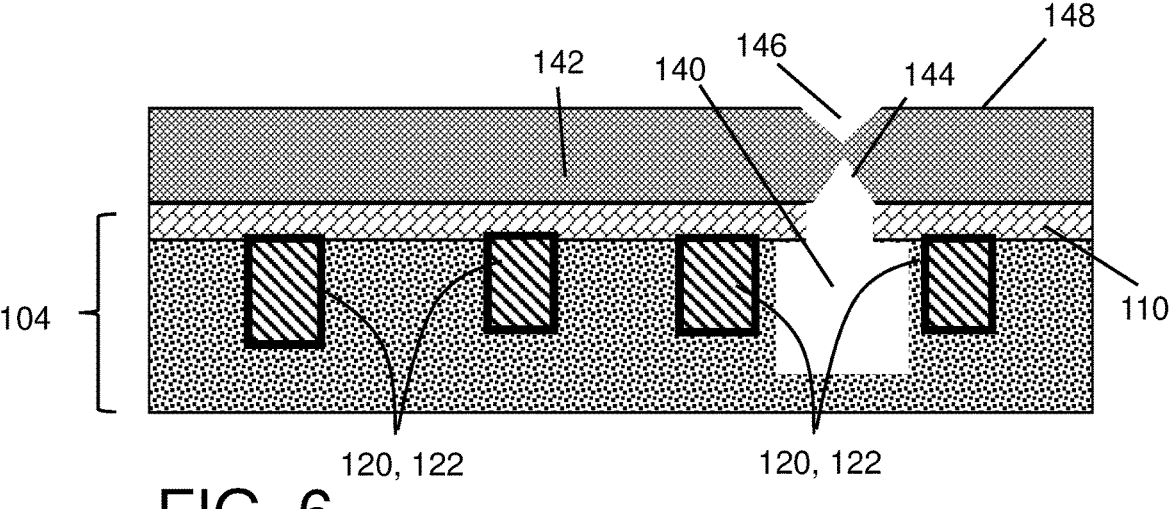

At this stage, in certain embodiments, opening 130 may be closed to form a first air gap 140 (see e.g., FIG. 6). Alternatively, FIG. 4 shows a cross-sectional view of an optional recessing of exposed sidewalls 136 of dielectric layer 104 in opening 130 to expand a lateral extent of first opening 130 after forming first opening 130. Among other benefits, recessing sidewalls 136 acts to enlarge opening 130 and air gap 140 (see e.g., FIG. 6), reducing the effective dielectric constant of first dielectric layer 104 while leaving the air gap top opening to be sealed (in the next process step) narrower than the air gap itself. If silicon dioxide films are used for dielectric layer 104 and silicon nitride is used for cap layer(s) 110, then a hydrofluoric acid (HF) wet etch could be used for this recess. HF concentrations could be in the range of 10:1 to 500:1 dilution with water, as known in the art. Because materials of first dielectric layer 104 etch faster than the dielectric of cap layer(s) 110, a width of opening 130 in first dielectric layer 104 is wider than that in cap layer(s) 110. Here, first opening 130 now extends under edges of cap layer 110. Recessing at this stage can also be used to further deepen opening 130. For example, where opening 130 did not extend through first dielectric layer 104 to meet or contact an underlying layer, recessing may extend opening 130 thereto or deepen opening 130 into first dielectric layer 104. For purposes of illustration, the drawings will show subsequent processing as though the recessing has occurred. It is apparent, however, that the teachings of the disclosure described hereafter are applicable to a structure that does not include the recessing step.

Figure 5:
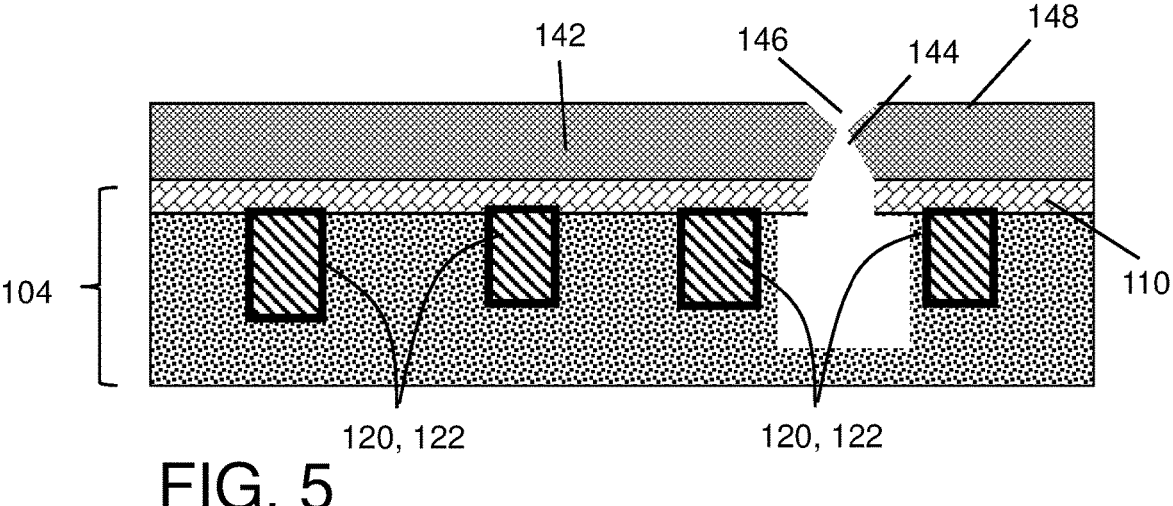
FIGS. 5 and 6 show cross-sectional views of forming a dielectric layer to form a first air gap, according to embodiments of the disclosure.

FIGS. 5 and 6 show cross-sectional views of forming a second dielectric layer 142 over first opening 130. Second dielectric layer 142 can do one of two things relative to forming air gap 140. It can, as shown in FIG. 5, stop before sealing first opening 130 to leave an end portion 144 of first opening 130 open, e.g., either with a gap or with a seam. Alternatively, as shown in FIG. 6, it can close end portion 144 of first opening 130 to form first air gap 140. In any event, second dielectric layer 142 includes an indentation or divot 146 in an upper surface 148 thereof over end portion 144 of first opening 130. More particularly, as second dielectric layer 142 is formed, first opening 130 creates a void which is partially filled by the layer but leaves indentation or divot 146 in upper surface 148 thereof. Second dielectric layer 142 may be formed using any appropriate deposition technique, e.g., CVD. Second dielectric layer 142 may include any appropriate dielectric material for capping an air gap 140. In certain embodiments, forming second dielectric layer 142 may include depositing at least one of: a silane-based silicon dioxide, a tetraethyl orthosilicate (TEOS) based silicon dioxide and a fluorinated TEOS (FTEOS) based silicon dioxide. In one embodiment, forming second dielectric layer 142 may include depositing only a silane-based silicon dioxide. In other embodiments, second dielectric layer 142 may include depositing any appropriate low-K material.

Figures 7, 8:
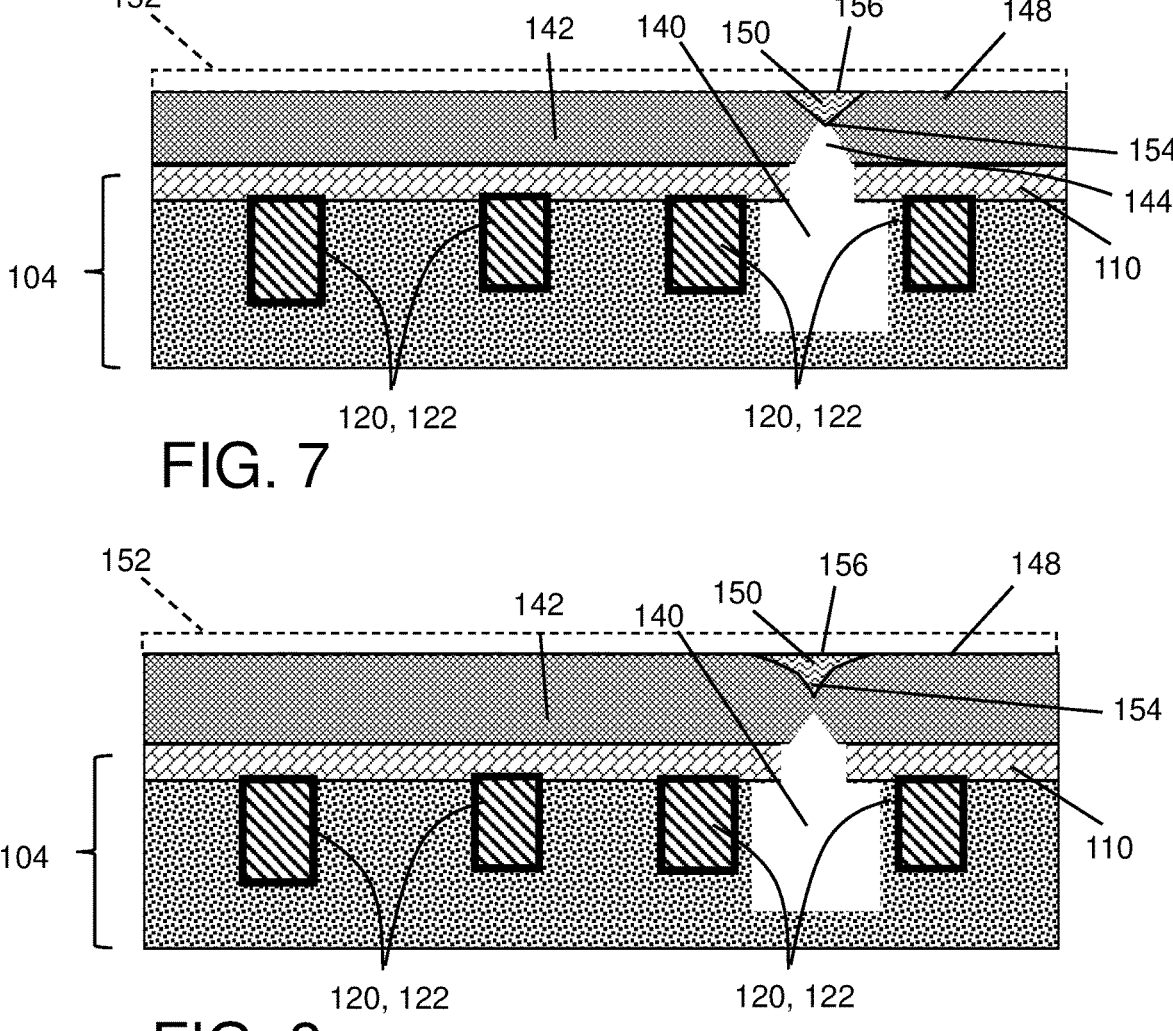
FIG. 7 shows a cross-sectional view of forming a discrete dielectric member where the discrete dielectric member seals the first opening to form the first air gap, according to embodiments of the disclosure.
FIG. 8 shows a cross-sectional view of forming a discrete dielectric member where a second dielectric layer seals the first opening to form the first air gap, according to embodiments of the disclosure.

FIGS. 7 and 8 show cross-sectional views of forming a discrete dielectric member 150 in indentation 146 (FIGS. 5-6). FIG. 7 shows an embodiment based on FIG. 5 in which second dielectric layer 142 does not close first opening 130. That is, where end portion 144 of first opening 130 remains open after forming second dielectric layer 142. In this case, discrete dielectric member 150 is over (closes) end portion 144 of first opening 130 to form first air gap 140. FIG. 8 shows an embodiment based on FIG. 6 in which second dielectric layer 142 is over (closes) first opening 130, creating first air gap 140. In any event, discrete dielectric member 150 is in second dielectric layer 142. Discrete dielectric member 150 may be formed by depositing another dielectric layer 152 (dashed lines), and planarizing, leaving discrete dielectric member(s) 150 in indentation 146. Discrete dielectric member 150 may include any now known or later developed dielectric material having a lower etch rate than the dielectric material around it (e.g., second dielectric layer 142 and/or third dielectric layer 160), such as an etch stop material including but not limited to: silicon nitride or silicon carbon nitride. The deposition may include depositing dielectric layer 152 over first dielectric layer 104 and in indentation 146, using any technique appropriate for the material deposited, e.g., ALD. The planarization may include any appropriate planarization technique such as but not limited to chemical mechanical polishing, perhaps including an etch back. In optional embodiments, a metal layer (not shown) may be formed over dielectric layer 152 to limit the planarization of the latter. If used, the metal layer is removed during the planarization.

As shown in FIGS. 7 and 8, discrete dielectric member 150 has a pointed (lower) end portion 154 and a planar surface 156 opposing pointed end portion 154. Discrete dielectric member 150 may have a triangular cross-section (FIG. 7), or a lower surface of discrete dielectric member 150 may enlarge in a curved manner toward planar surface 156 (FIG. 8)-similar to a top of a golf tee or a meeting region of a wine glass stem and bowl. Discrete dielectric member 150 may also have a length, e.g., into and out of the page. In contrast to an etch stop layer, discrete dielectric member 150 is a discrete dielectric element, disposed within second dielectric layer 142 and/or third dielectric layer 160, and has a pointed end portion 154 where it fills indentation 146 (FIGS. 7-8). For clarity of illustration, in subsequent drawings, discrete dielectric member 150 is shown in a triangle shape; however, it can also have the shape shown in FIG. 8.

Figure 9:
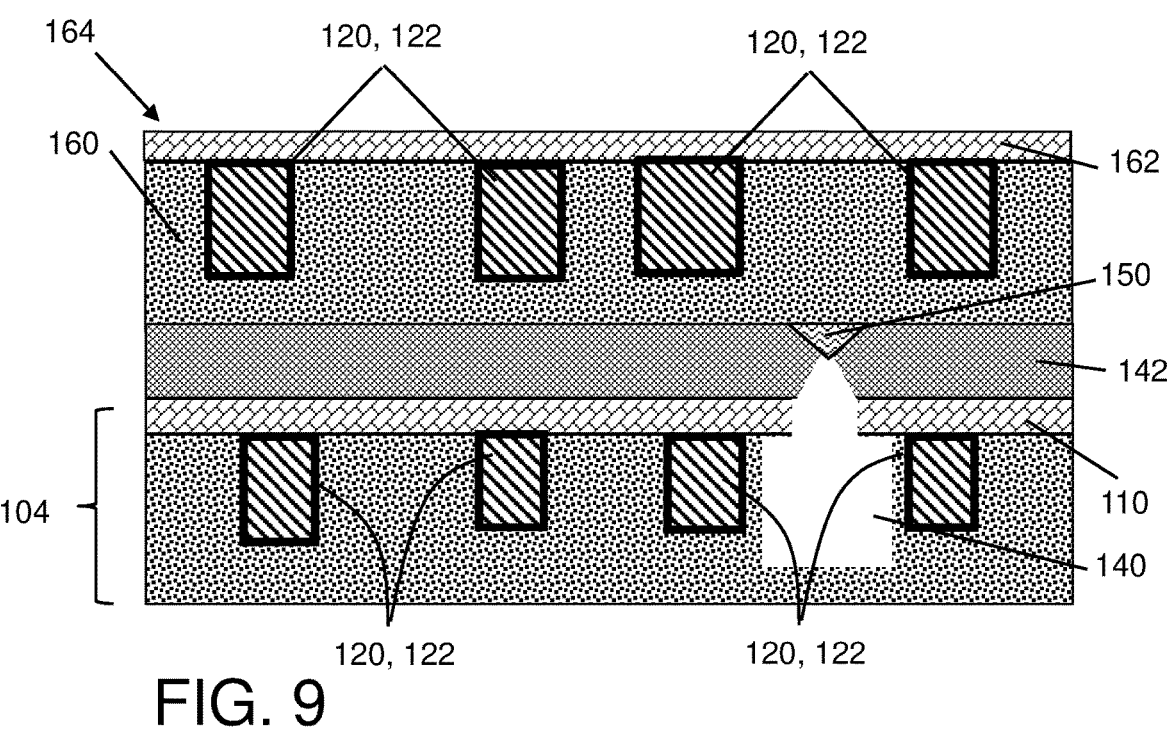
FIGS. 9 and 10 show cross-sectional views of forming a dielectric layer and an interconnect layer over the discrete dielectric member as in FIGS. 7 and 8, respectively, according to embodiments of the disclosure.
Figure 10:
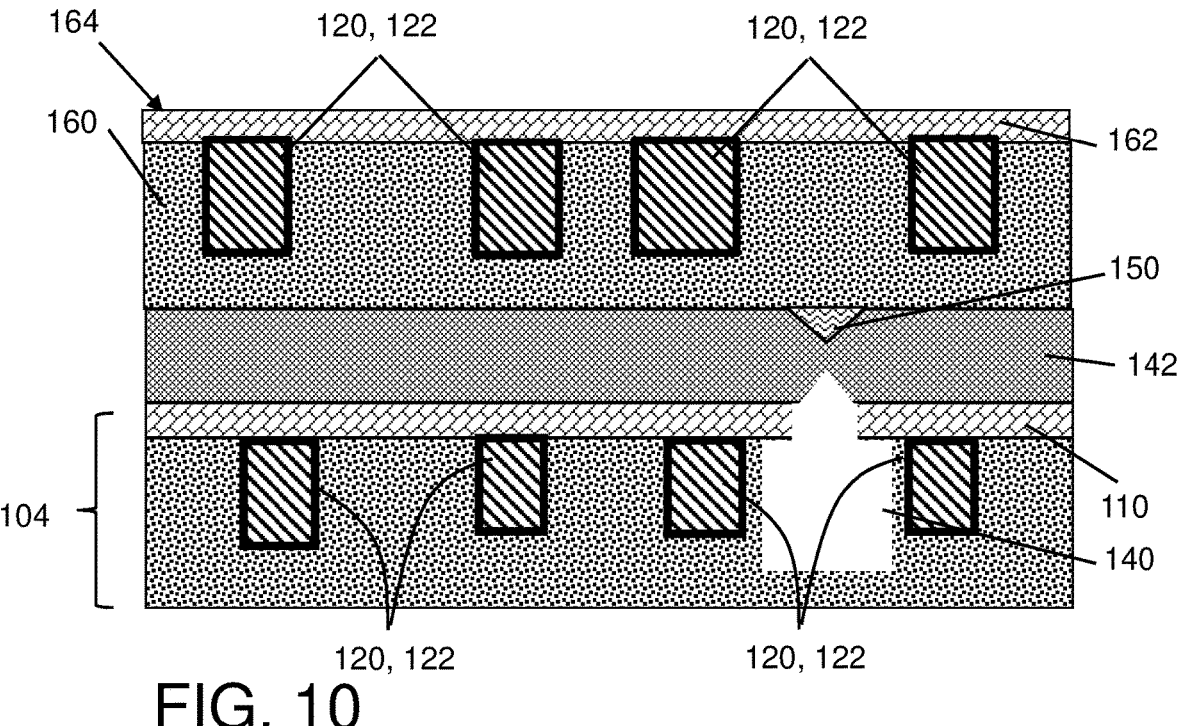

FIGS. 9 and 10 show cross-sectional views of forming a third dielectric layer 160 over second dielectric layer 142 and discrete dielectric member 150. FIG. 9 shows an embodiment based on FIG. 7 in which discrete dielectric member 150 is over (closes) first opening 130, and FIG. 10 shows an embodiment based on FIG. 8 in which second dielectric layer 142 is over (closes) first opening 130. In FIGS. 9-10, third dielectric layer 160 may function as any interconnect layer, e.g., middle-of-line (MOL) or back-end-of-line (BEOL). Dielectric layer 160 may include a contact layer or a metal layer. In the non-limiting example in FIGS. 9-10, dielectric layer 160 provides a metal layer. In any event, third dielectric layer 160 layer may include an ILD. ILDs may include but are not limited to: silicon nitride ($Si_3N_4$), silicon dioxide ($SiO_2$), fluorinated $SiO_2$ (FSG), a silane-based silicon dioxide, a tetraethyl orthosilicate (TEOS) based silicon dioxide and a fluorinated TEOS (FTEOS) based silicon dioxide. In other embodiments, third dielectric layer 160 may include any appropriate low-K material. Dielectric layer 160 may also include a cap layer 162 at an upper surface thereof. Cap layer 162 may include one or more layers. For example, cap layer 162 may act as an etch stop layer, and be formed from silicon nitride (nitride), silicon carbon nitride (SiCN) and/or silicon oxide ($SiO_2$), among other layers, as known in the art. As understood, various other forms of cap layers may also be employed. Conductors 120 may include contacts or metal wires (shown) and may be formed as previously described herein.

FIGS. 9 and 10 also show a structure 164 according to embodiments of the disclosure. Structure 164 may include first air gap 140 in first dielectric layer 104, and second dielectric layer 142 over first air gap 140. Discrete dielectric member 150 is positioned in second dielectric layer 142 and aligned over first air gap 140. Structure 164 may be located in any MOL or BEOL layers in which air gap 140 is used.

Figure 11:
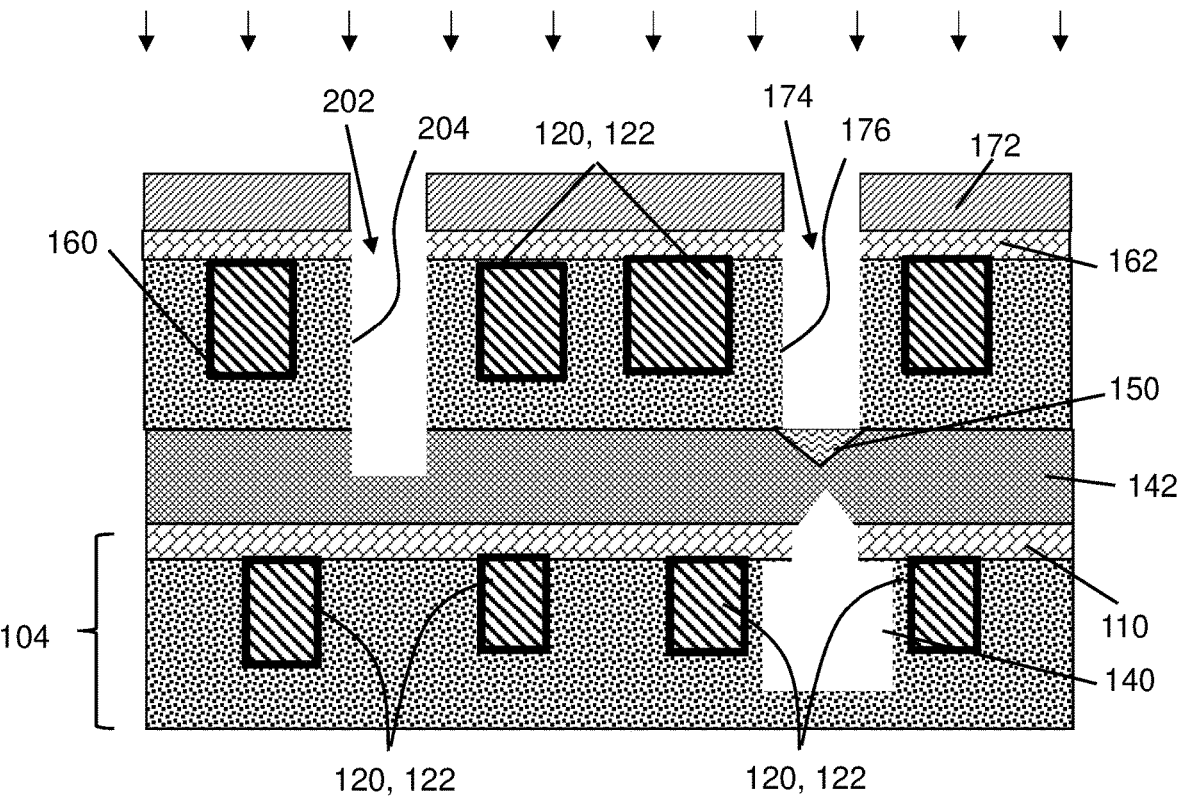
FIG. 11 shows a cross-sectional view of forming a second opening for a second air gap using the discrete dielectric member and optionally forming a third opening for a third air gap, according to embodiments of the disclosure.

In other embodiments, the method may continue to form another, second air gap 190 (FIG. 13) in third dielectric layer 160. FIG. 11 shows a cross-sectional view of forming a second opening 174 in third dielectric layer 160 over at least a portion of first air gap 140. For purposes of description, the method will only be illustrated relative to the embodiment in which second dielectric layer 142 is over (closes) first opening 130 (FIGS. 3-4). FIG. 11 shows forming an air gap mask 172 (hereafter "mask 172") exposing a portion of third dielectric layer 160, e.g., cap layer 162. Mask 172 may be formed using any now known or later developed masking material. Mask 172 is patterned and etched in a conventional fashion to create opening(s) therein that aligned over discrete dielectric member(s) 150. While a particular width of an opening in mask 172 has been illustrated, the opening can be larger to create a laterally larger second opening 174 and air gap 190 (FIG. 13)—see e.g., FIG. 15. FIG. 11 also shows a cross-sectional view of etching second opening 174 through third dielectric layer 160 (including cap layer 162) using mask 172. Second opening 174 exposes sidewalls 176 of third dielectric layer 160. In FIG. 11, the etching may include, for example, a RIE. Second opening 174 may extend to discrete dielectric member 150. That is, etching second opening 174 may cease when opening 174 exposes discrete dielectric member 150, thus preventing etching for second air gap 190 (FIG. 13) from: piercing into first air gap 140, causing non-uniform center-to-edge dimensions in different regions of a wafer, and/or deepening first air gap 140. In this manner, discrete dielectric member 150 acts as a discrete etch stop member. In other embodiments, second opening 174 may not expose discrete dielectric member 150, leaving some of third dielectric layer 160 between second opening 174 (and second air gap 190 (FIG. 13)) and discrete dielectric member 150.

Figure 12:
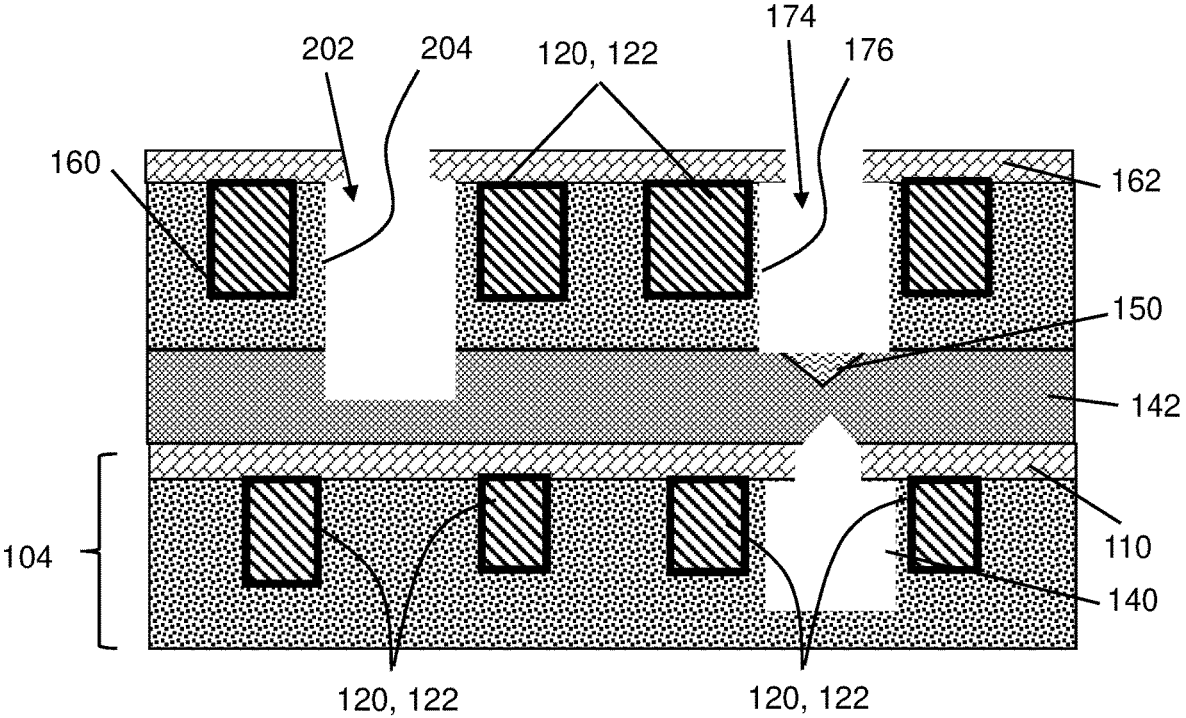
FIG. 12 shows a cross-sectional view of optionally recessing the second and third openings, according to embodiments of the disclosure.
Figure 13:
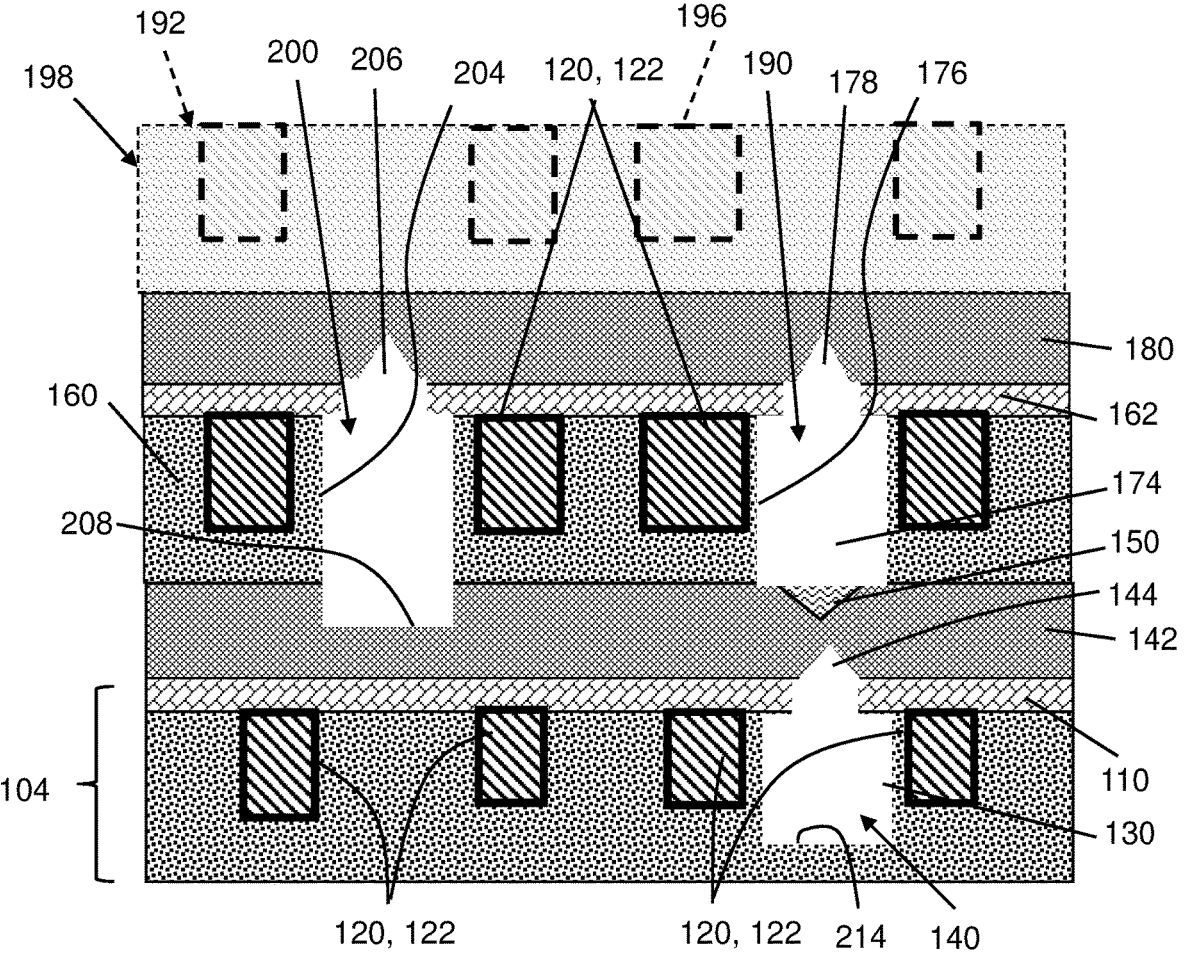
FIG. 13 shows a cross-sectional view of a structure and forming a fourth dielectric layer to form a second air gap and optionally a third air gap, according to embodiments of the disclosure.

FIG. 12 shows a cross-sectional view of the structure after removing mask 172 (FIG. 11). Mask 172 may be removed using any known removal process appropriate for the mask material, e.g., a wet etch for hard nitride mask or an ashing process (oxygen dry strip process) for a soft resist-based mask. At this stage, in certain embodiments, second opening 174 may be closed to form a second air gap 190 (FIG. 13). Alternatively, as described relative to FIG. 4 and as shown in FIG. 12, an optional recessing of exposed sidewalls 176 of third dielectric layer 160 in second opening 174 to expand a lateral extent of second opening 174 after forming second opening 174 may be performed. This process is substantially similar to that described relative to FIG. 4 and would result in expanding a lateral extent of second opening 174 after forming second opening 174. Here, second opening 174 now extends under edges of cap layer 162.

FIG. 13 shows a cross-sectional view of forming a fourth dielectric layer 180 over second opening 174 (FIG. 12) to close an end portion 178 of second opening 174 (FIG. 12) and form a second air gap 190. In certain embodiments, forming fourth dielectric layer 180 may include depositing at least one of: a silane-based silicon dioxide, a tetraethyl orthosilicate (TEOS) based silicon dioxide and a fluorinated TEOS (FTEOS) based silicon dioxide. In one embodiment, forming fourth dielectric layer 180 may include depositing only a silane-based silicon dioxide. In other embodiments, forming fourth dielectric layer 180 may include depositing any appropriate low-K material.

Subsequent processing, shown in dashed lines in FIG. 13 may include forming another interconnect layer 192 (contact or metal layer) over fourth dielectric layer 180 in any now known or later developed fashion. In the non-limiting example of FIG. 13, a wiring layer 192 is formed over second and third air gaps 190, 200. Wiring layer 192 may be formed using any now known or later developed process. For example, wiring layer 192 may be formed by forming another dielectric layer 194 over fourth dielectric layer 180 or continuing formation of fourth dielectric layer 180, and patterning wiring openings therein, depositing a liner and conductor, and planarizing to create wires 196. Dielectric layer 194 may include any ILD material listed herein. Prior to, or with forming of wiring layer 192, any desired contacts may be formed through lower dielectric layers, e.g., by forming openings therefor, depositing a liner and conductor, and planarizing to create the contacts. Wires and contacts may also be patterned separately but metallized and planarized simultaneously. Any number of additional interconnect layers can be subsequently formed.

FIG. 13 also shows a structure 198 according to embodiments of the disclosure. Structure 198, in addition to the elements of structure 164, may include second air gap 190 in at least third dielectric layer 160 over second dielectric layer 142 (and perhaps in second dielectric layer 142, see e.g., FIG. 15) and over at least a portion of first air gap 140. Discrete dielectric member 150 is positioned in second dielectric layer 142 between first air gap 140 and second air gap 190. In FIG. 13, first air gap 140 includes first opening 130 defined in first dielectric layer 104 with second dielectric layer 142 closing end portion 144 of first opening 130. Second air gap 190 includes second opening 174 defined in at least third dielectric layer 160 (and perhaps in second dielectric layer 142) over second dielectric layer 142, and a fourth dielectric layer 180 over second opening 174 and closing end portion 178 of second opening 174. In certain embodiments, first, second, third and fourth dielectric layers may include but are not limited to: silicon nitride ($Si_3N_4$), silicon dioxide ($SiO_2$), fluorinated $SiO_2$ (FSG), a silane-based silicon dioxide, a tetraethyl orthosilicate (TEOS) based silicon dioxide and a fluorinated TEOS (FTEOS) based silicon dioxide. In other embodiments, the four dielectric layers 104, 142, 160, 180 may include a silane-based silicon dioxide, a tetraethyl orthosilicate (TEOS) based silicon dioxide and/or a fluorinated TEOS (FTEOS) based silicon dioxide. In other embodiments, only dielectric layers 142, 180 that seal an opening 130, 174 may include a silane-based silicon dioxide, a tetraethyl orthosilicate (TEOS) based silicon dioxide and/or a fluorinated TEOS (FTEOS) based silicon dioxide. In other embodiments, dielectric layers 142, 180 that seal an opening 130, 174 may include only a silane-based silicon dioxide. In other embodiments, dielectric layers 142, 180 may include any appropriate low-K material. Structure 198 may also include at least one of first air gap 140 and second air gap 190 positioned between conductors 120 in first dielectric layer 104 and third dielectric layer 160, respectively.

Referring to FIGS. 11-13 collectively, the method may optionally include forming a third air gap 200 defined in at least third dielectric layer 160 adjacent second air gap 190. Third air gap 200 is formed in a location that is devoid of first air gap 140 thereunder in first dielectric layer 104, i.e., any dielectric immediately below it. This process may include, as shown in FIG. 11, forming a third opening 202 in third dielectric layer 160. Here, mask 172 may also expose another portion of third dielectric layer 160, e.g., cap layer 162, where third air gap 200 (FIG. 13) is to be positioned. FIG. 11 also shows etching third opening 202 into third dielectric layer 160 (including cap layer 162) and perhaps some of second dielectric layer 142 using mask 172, i.e., at the same time as etching second opening 174. Third opening 202 may be deeper than second opening 174 because etching of second opening 174 ceases when it exposes discrete dielectric member 150, while etching of third opening 202 deepens third opening 202. Third opening 202 exposes sidewalls 204 of third dielectric layer 160 and perhaps second dielectric layer 142. In FIG. 11, the etching may include, for example, a RIE.

In FIG. 12, mask 172 may be removed in a manner previously described. As shown, an optional recessing of exposed sidewalls 204 of third dielectric layer 160 (and perhaps second dielectric layer 142) in third opening 202 may be performed to expand a lateral extent of third opening 202 after forming third opening 202. This recessing process is substantially similar to that previously described herein. Third opening 202 may extend under edges of cap layer 162.

As previously described relative to second opening 174 (FIG. 12), FIG. 13 also shows forming fourth dielectric layer 180 over third opening 202 (FIG. 12) to close an end portion 206 of third opening 202 (FIG. 12) and form third air gap 200. As shown in FIG. 13, third air gap 200 includes a lowermost extent extending deeper into at least third dielectric layer 160 (could also be second dielectric layer 142) than a lowermost extent of second air gap 190. As also shown in FIG. 13, because third air gap 200 was not formed with discrete dielectric member 150, third air gap 200 includes a planar lower end portion 208, i.e., without discrete dielectric member 150 therein.

FIG. 13 also shows structure 198 optionally including third air gap 200 defined in at least third dielectric layer 160 (and perhaps second dielectric layer 142) adjacent second air gap 190. Third air gap is 200 is devoid of an air gap thereunder in first dielectric layer 104, i.e., any immediately lower dielectric layers. In FIG. 13, due to the presence of discrete dielectric member 150 stopping etching of second opening 174 before penetrating to first air gap 140, third air gap 200 includes a lowermost extent extending deeper into one of second or third dielectric layer 142, 160 than a lowermost extent of second air gap 190. Without discrete dielectric member 150 under third opening 202 for third air gap 200, third air gap 200 has a planar lower end portion 208.

Figure 14:
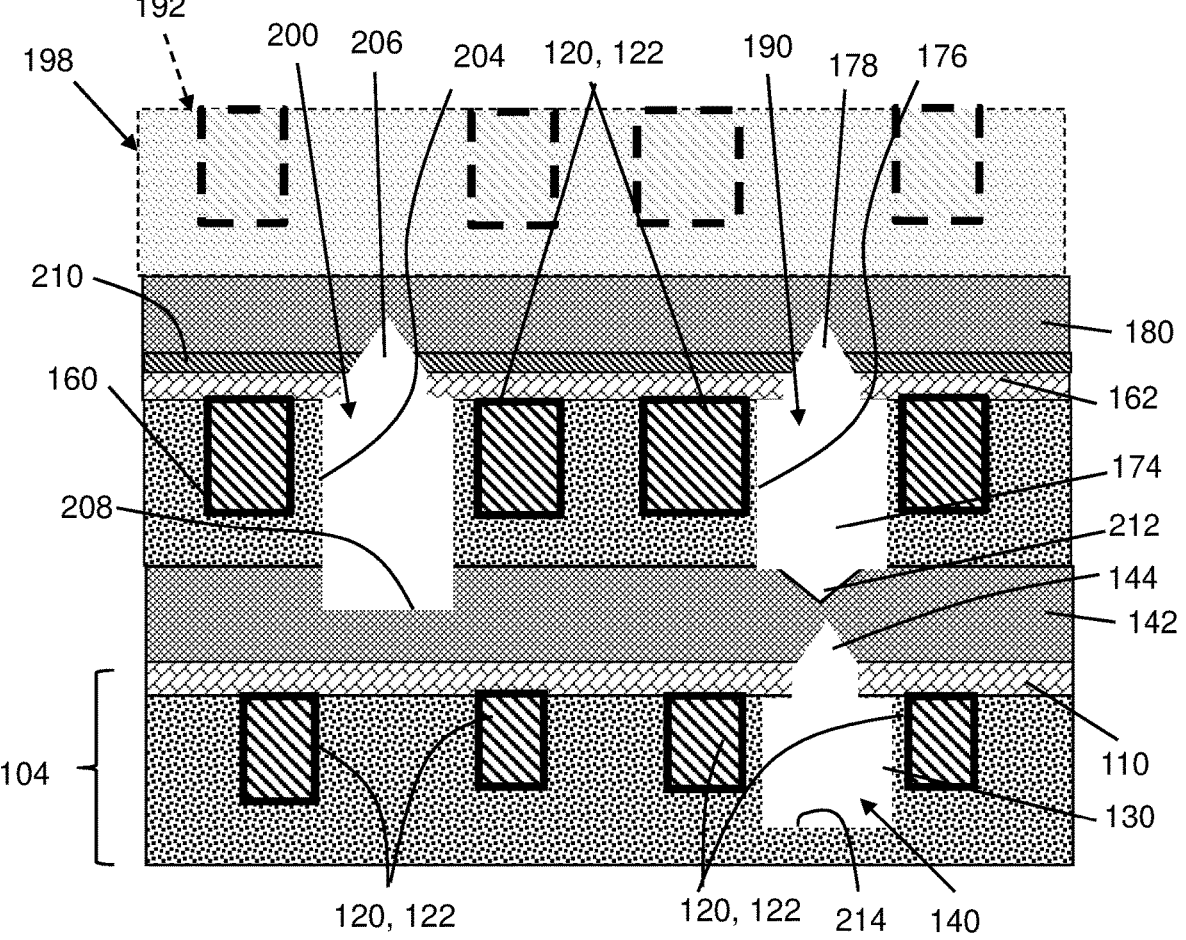
FIG. 14 shows a cross-sectional view of a structure and forming a fourth dielectric layer to form a second air gap, and optionally a third air gap, where the discrete dielectric member is removed, according to embodiments of the disclosure.

FIG. 14 shows a cross-sectional view of a structure according to an optional embodiment in which discrete dielectric member 150 is removed as part of forming second air gap 190. Discrete dielectric member 150 can be removed after processing as shown in either FIG. 11 or 12. That is, it can be removed after second opening 174 formation (FIG. 11), or after formation and enlargement of second opening 174 (FIG. 12). The removal process may include any etching chemistry appropriate for selective removal of the dielectric material of discrete dielectric member 150, such as but not limited to a phosphoric acid wet etch where discrete dielectric member 150 includes silicon nitride. In this case, as shown in FIG. 14, when discrete dielectric member 150 has been removed, an additional capping layer 210 may be optionally provided over third dielectric layer 160 (as an additional layer of cap layer 162) before forming second opening 174. Additional capping layer 210 may include any capping material listed herein, e.g., silicon oxide, and is provided where additional protection of third dielectric layer 160 is required from the etching chemistry to remove discrete dielectric member 150. As shown in FIG. 14, where discrete dielectric member 150 is removed, second air gap 190 has a pointed lower end portion 212, i.e., where the pointed end portion of discrete dielectric member 150 is removed from second dielectric layer 142. In contrast, first air gap 140 has a planar lower end portion 214. While shown as though discrete dielectric member 150 is triangular, surfaces of second dielectric layer 142 may be curved where discrete dielectric member 150 has the shape shown in FIG. 8.

Figure 15:
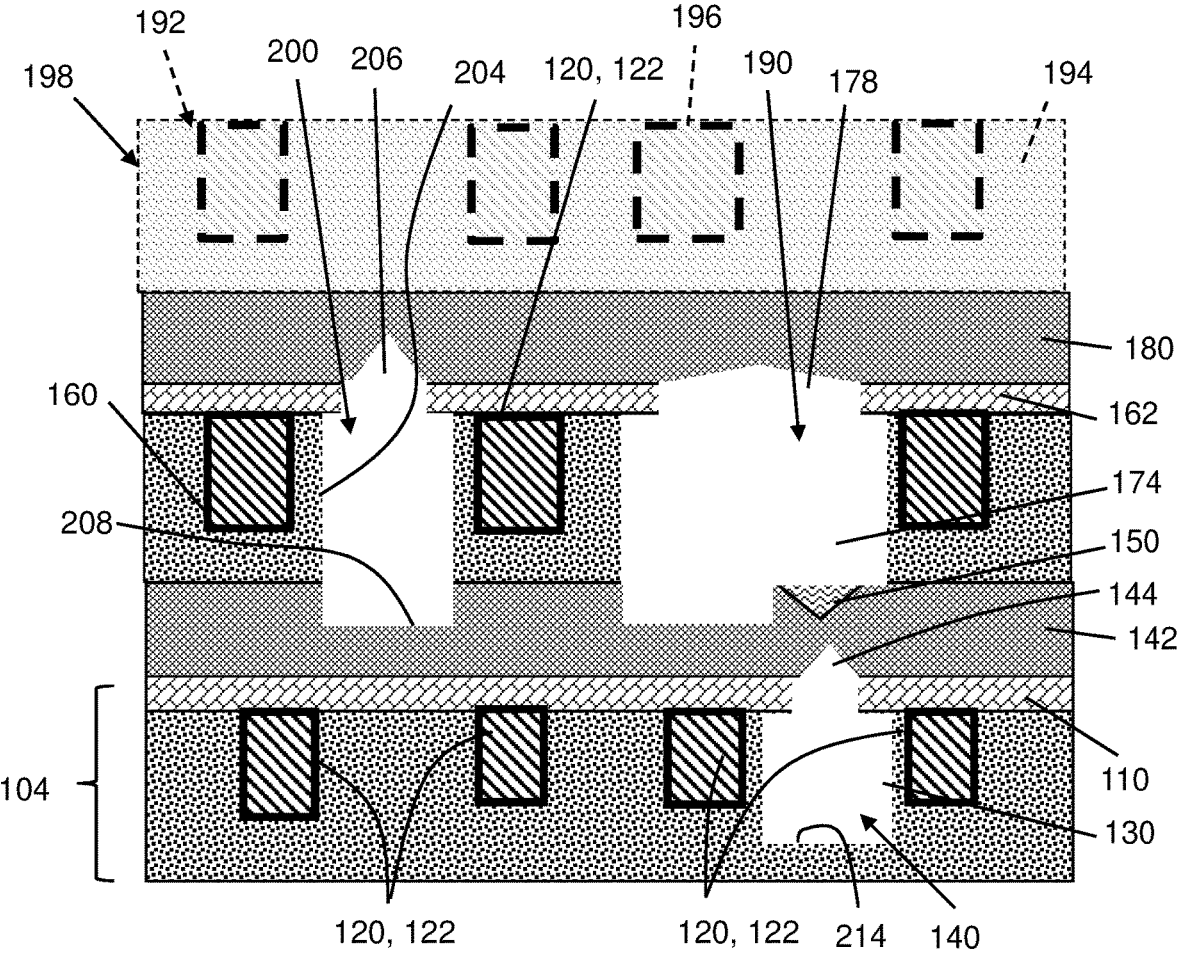
FIG. 15 shows a cross-sectional view of a structure including a laterally larger second air gap, according to embodiments of the disclosure.

FIG. 15 shows another alternative embodiment in which an opening to form second opening 174 in mask 172 (FIG. 11) is larger than a width of discrete dielectric member 150. Here, second opening 174 is formed over discrete dielectric member 150 to a first depth in third dielectric layer 160. In addition, second opening 174 is formed to a second, larger depth in at least third dielectric layer 160 and perhaps some of second dielectric layer 142 where second opening 174 is not over discrete dielectric member 150. The second, larger depth may be similar to that of third air gap 200 where no air gap 140 exists thereunder.

Figure 16:
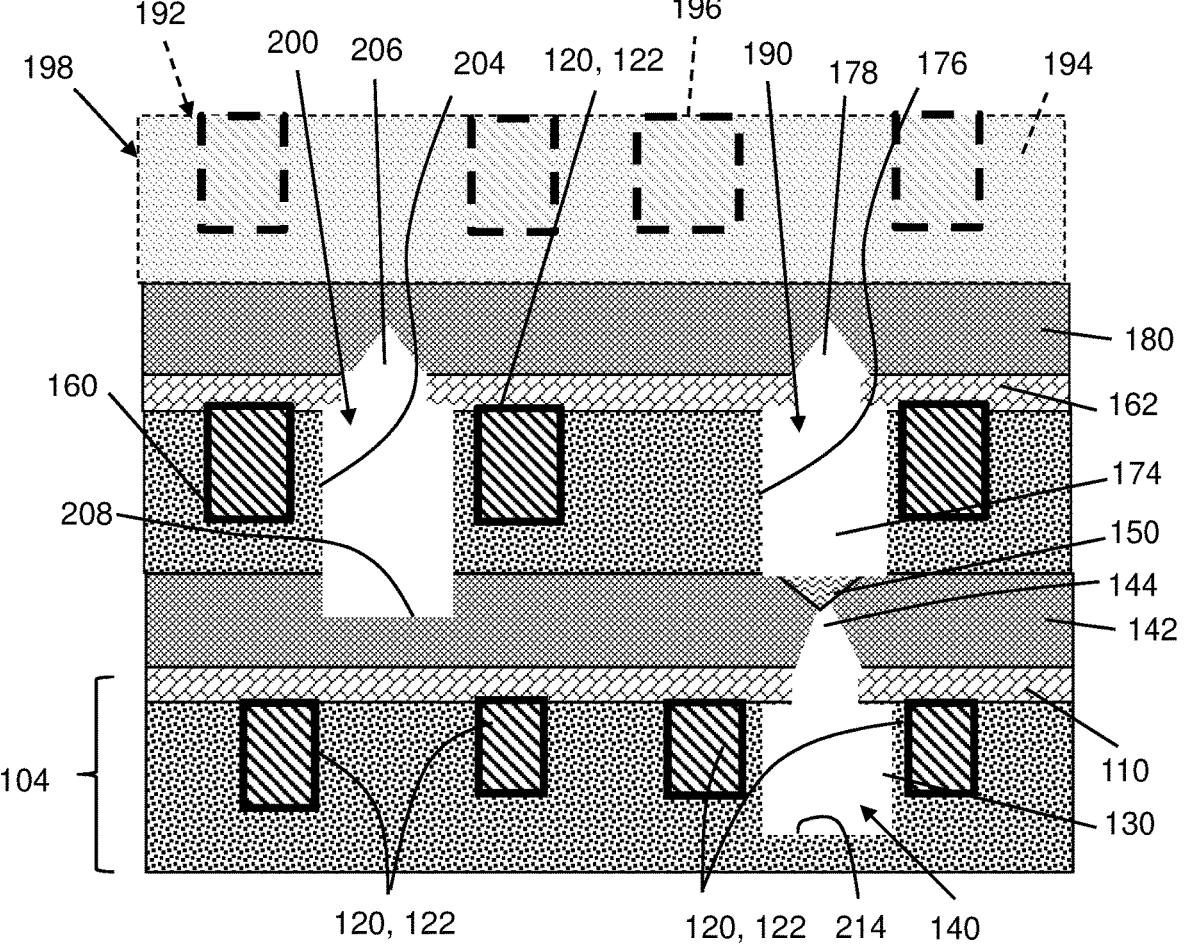
FIG. 16 shows a cross-sectional view of a structure in which a discrete dielectric member seals a first air gap, according to embodiments of the disclosure.

FIG. 16 shows a cross-sectional view of another alternative embodiment of structure 198 based on the FIG. 7 embodiment in which discrete dielectric member 150 seals end portion 144 of first opening 130 for first air gap 140. In this embodiment, first air gap 140 includes first opening 130 defined in first dielectric layer 104, and discrete dielectric member 150 is over (closes) end portion 144 of first opening 130. In FIG. 16, second air gap 190 includes second opening 174 defined in at least third dielectric layer 160 over second dielectric layer 142, and a third dielectric layer over second opening 174 and closing end portion 178 of second opening 174. While shown with enlarged openings 174, 202, the enlarging process of FIG. 12 can be omitted in which case air gaps 190, 200 would be narrower than shown, i.e., they would not extend under edges of cap layer 162.

As understood in the art, openings 130, 174, 202 for air gaps 140, 190, 200 can take a variety of lateral forms. For example, openings 130, 174, 202 may be laterally elongate openings (into and out of page). That is, rather than simple vertical openings, openings 130, 174, 202 may have a length into or out of the page as illustrated. Alternatively, a portion of openings 130, 174, 202 may be etched in a laterally disposed T-shape, i.e., in a T-shape laid out horizontally into the plane of the page. Alternatively, or in addition thereto, openings 130, 174, 202 may also be formed with different widths (see also e.g., FIG. 15). For example, openings 130, 174, 202 may be designed such that they are narrower adjacent to certain conductors 120 to reduce the likelihood of a conductor intersects the eventually formed air gap structure; or openings 130, 174, 202 may be etched as many, not necessarily elongated, disconnected openings. Air gaps 140, 190, 200 may have shapes similar to those noted for openings 130, 174, 202. Similarly, discrete dielectric member 150 in second air gap 190 can have a similar lateral shape as air gap 190.

While discrete dielectric member 150 is used to protect first air gap 140 during formation of second air gap 190, it will be recognized that the teachings of the disclosure can be used repeatedly for aligned air gaps, e.g., for forming another air gap over second air gap 190 in dielectric layer(s) 180, 194.

Embodiments of the disclosure provide various technical and commercial advantages, examples of which are discussed herein. As will be recognized, structures 164, 198 can be used in any MOL or BEOL layer to reduce capacitance. Further, structures 164, 198 may be used over a transistor in a variety of devices, such as but not limited to: a radio frequency switch, a low amplitude amplifier, a power amplifier, etc. The discrete dielectric member prevents forming an opening for the second air gap from penetrating the first, lower air gap, and prevents non-uniform center-to-edge dimensions and/or non-uniform depths of the first air gaps across a wafer. Use of air gaps 140, 190, 200 according to the various embodiments of the disclosure may reduce more capacitance compared to a single air gap over multiple layers. Use of a multi-layer air gap 140, 190 extending over two or more metal or contact layers, also reduces more parasitic capacitance than a single layer air gap. The processes described herein, compared to forming a multi-layer, single air gap, significantly reduces the variation in center-to-edge dimensions and depth across a wafer. The multi-layer air gap using the discrete dielectric member 150 can ensure sufficient process margin even for future technology nodes, e.g., beyond 14 nanometers. Where additional reduction in off-capacitance is desired, a bottom of both first and second air gaps 140, 190 can be laterally enlarged, and/or a depth of second air gap 190 can be increased.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a first air gap partially defined within a first opening in a first dielectric layer;
   a second dielectric layer over the first dielectric layer, wherein an end portion of the first air gap extends above the first dielectric layer into a lower portion of the second dielectric layer, and wherein an upper portion of the second dielectric layer over the first opening encloses the first air gap;
   a second air gap over at least a portion of the first air gap, the second air gap including a second opening defined in at least a third dielectric layer over the second dielectric layer, and a fourth dielectric layer over the second opening, wherein the second air gap has a pointed lower end portion; and
   a third air gap defined in at least the third dielectric layer adjacent the second air gap, wherein the third air gap is devoid of an air gap thereunder in the first dielectric layer, and wherein the third air gap includes a planar lower end portion having a lowermost extent extending deeper into one of the second dielectric layer and the third dielectric layer than a lowermost extent of the second air gap.

2. The structure of claim 1, wherein at least one of the first, second, third and fourth dielectric layers include at least one of: a silane-based silicon dioxide, a tetraethyl orthosilicate (TEOS) based silicon dioxide and a fluorinated TEOS (FTEOS) based silicon dioxide.

3. The structure of claim 1, wherein the first air gap has a planar lower end portion.

4. The structure of claim 1, wherein at least one of the first air gap and the second air gap is positioned between conductors in the first dielectric layer and the third dielectric layer, respectively.

5. A structure, comprising:
a first air gap partially defined within a first opening in a first dielectric layer;
a second dielectric layer over the first dielectric layer, wherein an end portion of the first air gap extends above the first dielectric layer into a lower portion of the second dielectric layer, and wherein an upper portion of the second dielectric layer over the first opening partially encloses the first air gap; and
a discrete dielectric member embedded within the second dielectric layer and aligned over and contacting the first air gap, the discrete dielectric member including a different dielectric material than the second dielectric layer.

6. The structure of claim 5, further comprising a second air gap in at least a third dielectric layer over the second dielectric layer and over at least a portion of the first air gap, and the discrete dielectric member positioned in the second dielectric layer between the first air gap and the second air gap.

7. The structure of claim 6, wherein the second air gap includes a second opening defined in at least the third dielectric layer, and a fourth dielectric layer over the second opening and closing an end portion of the second opening.

8. The structure of claim 7, wherein the first, second, third and fourth dielectric layers include at least one of: a silane-based silicon dioxide, a tetraethyl orthosilicate (TEOS) based silicon dioxide and a fluorinated TEOS (FTEOS) based silicon dioxide.

9. The structure of claim 6, wherein at least one of the first air gap and the second air gap is positioned between conductors in the first dielectric layer and the third dielectric layer, respectively.

10. The structure of claim 6, further comprising a third air gap defined in at least the third dielectric layer adjacent the second air gap, wherein the third air gap is devoid of an air gap thereunder in the first dielectric layer, and wherein the third air gap includes a lowermost extent extending deeper into one of the second and third dielectric layers than a lowermost extent of the second air gap.

11. The structure of claim 10, wherein the third air gap includes a planar lower end portion.

12. The structure of claim 6, wherein the first air gap includes a first opening defined in the first dielectric layer, and wherein the discrete dielectric member is over an end portion of the first opening; and
wherein the second air gap includes a second opening defined in at least a third dielectric layer over the second dielectric layer, and a fourth dielectric layer is over an end portion of the second opening.

13. A method, comprising:
forming a first opening in a first dielectric layer;
forming a second dielectric layer over the first dielectric layer to stop before sealing the first opening to leave an end portion of the first opening, within a lower portion of the second dielectric layer open, and to close the end portion of the first opening with an upper portion of the second dielectric layer to form a first air gap, wherein the second dielectric layer includes an indentation in an upper surface thereof over the end portion of the first opening;
forming a discrete dielectric member in the indentation, wherein where the end portion remains open after forming the second dielectric layer, the discrete dielectric member closes the end portion of the first opening to form the first air gap;
forming a third dielectric layer over the second dielectric layer and the discrete dielectric member;
forming a second opening in at least the third dielectric layer over at least a portion of the first air gap;
forming a third opening in at least the third dielectric layer adjacent the second opening, wherein the third opening is devoid of an air gap thereunder in the first dielectric layer, and wherein the third opening includes a lowermost extent extending deeper into the second dielectric layer than a lowermost extent of the second opening; and
forming a fourth dielectric layer over the second opening and the third opening to close an end portion of the second opening and the third opening to form a second air gap and a third air gap, respectively.

14. The method of claim 13, wherein forming the discrete dielectric member includes depositing another dielectric layer over the first dielectric layer and in the indentation, and planarizing the another dielectric layer, and
wherein the discrete dielectric member has a pointed end portion and a planar surface opposing the pointed end portion.

15. The method of claim 13, wherein forming the second opening includes etching the at least third dielectric layer to expose the discrete dielectric member.

16. The method of claim 13, further comprising expanding at least one of: a lateral extent of the first opening after forming the first opening, and a lateral extent of the second opening after forming the second opening.

17. The method of claim 13, wherein forming at least one of the second dielectric layer and the fourth dielectric layer includes depositing at least one of: a silane-based silicon dioxide, a tetraethyl orthosilicate (TEOS) based silicon dioxide and a fluorinated TEOS (FTEOS) based silicon dioxide.

18. The method of claim 13, further comprising forming a capping layer over the third dielectric layer prior to forming the second opening, and after forming the second opening, removing the discrete dielectric member.

* * * * *